United States Patent
Edelstein et al.

(10) Patent No.: US 9,332,628 B2
(45) Date of Patent: May 3, 2016

(54) MICROELECTRONIC STRUCTURE INCLUDING AIR GAP

(71) Applicant: GLOBALFOUNDRIES INC., Grand Cayman (KY)

(72) Inventors: Daniel C. Edelstein, White Plains, NY (US); David V. Horak, Essex Junction, VT (US); Elbert E. Huang, Carmel, NY (US); Satyanarayana V. Nitta, Poughquag, NY (US); Takeshi Nogami, Schenectady, NY (US); Shom Ponoth, Gaithersburg, MD (US); Terry A. Spooner, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/739,703

(22) Filed: Jun. 15, 2015

(65) Prior Publication Data
US 2015/0289361 A1 Oct. 8, 2015

Related U.S. Application Data

(62) Division of application No. 13/614,524, filed on Sep. 13, 2012, now Pat. No. 9,059,251, which is a division of application No. 12/770,254, filed on Apr. 29, 2010, now Pat. No. 8,288,268.

(51) Int. Cl.
| | |
|---|---|
| *H01L 23/48* | (2006.01) |
| *H01L 23/52* | (2006.01) |
| *H01L 29/40* | (2006.01) |
| *H05K 1/02* | (2006.01) |
| *H01L 21/768* | (2006.01) |
| *H05K 1/03* | (2006.01) |

(52) U.S. Cl.
CPC .......... *H05K 1/0216* (2013.01); *H01L 21/7682* (2013.01); *H01L 21/76832* (2013.01); *H01L 21/76834* (2013.01); *H01L 21/76849* (2013.01); *H01L 21/76852* (2013.01); *H05K 1/0298* (2013.01); *H05K 1/03* (2013.01); *H05K 2201/0707* (2013.01); *H05K 2201/09063* (2013.01)

(58) Field of Classification Search
CPC .................. H01L 21/7682; H01L 21/76832
USPC .................................................. 257/750–758
See application file for complete search history.

(56) References Cited

U.S. PATENT DOCUMENTS

| | | | |
|---|---|---|---|
| 5,960,311 | A | 9/1999 | Singh et al. |
| 6,159,845 | A | 12/2000 | Yew et al. |
| 6,265,257 | B1 | 7/2001 | Hsu et al. |
| 6,331,481 | B1 | 12/2001 | Stamper et al. |
| 7,939,446 | B1 | 5/2011 | Clevenger et al. |

(Continued)

OTHER PUBLICATIONS

Harada, et al., "Extremely Low Keff(–1.9) Cu Interconnects With Air Gap Formed Using SiOC", International Interconnect Technology Conference, IEEE 2007, Jun. 4-6, 2007, pp. 141-143.

*Primary Examiner* — Cuong Q Nguyen
(74) *Attorney, Agent, or Firm* — Scully, Scott, Murphy & Presser, P.C.

(57) ABSTRACT

A microelectronic structure and a method for fabricating the microelectronic structure provide a plurality of voids interposed between a plurality of conductor layers. The plurality of voids is also located between a liner layer and an inter-level dielectric layer. The voids provide for enhanced electrical performance of the microelectronic structure.

12 Claims, 7 Drawing Sheets

(56) References Cited

U.S. PATENT DOCUMENTS

| | | |
|---|---|---|
| 8,034,693 B2 | 10/2011 | Shibata et al. |
| 8,035,232 B2 | 10/2011 | Harada et al. |
| 8,114,768 B2 | 2/2012 | Li et al. |
| 8,288,268 B2 | 10/2012 | Edelstein et al. |
| 9,059,251 B2 * | 6/2015 | Edelstein et al. |
| 9,105,693 B2 * | 8/2015 | Edelstein et al. |
| 2007/0284662 A1 | 12/2007 | Chinthakindi et al. |
| 2008/0029844 A1 | 2/2008 | Adkisson et al. |
| 2008/0073115 A1 | 3/2008 | Gupta et al. |
| 2009/0093112 A1 | 4/2009 | Al-Bayati et al. |
| 2010/0055898 A1 | 3/2010 | Chang et al. |

* cited by examiner

MICROELECTRONIC STRUCTURE INCLUDING AIR GAP

FIELD OF THE INVENTION

The invention relates generally to microelectronic structures. More particularly, the invention relates to microelectronic structures with enhanced performance.

DESCRIPTION OF THE RELATED ART

Microelectronic structures, and more particularly semiconductor structures, include semiconductor substrates within and upon which are formed semiconductor devices that in turn are connected and interconnected with patterned conductor layers that are separated by dielectric layers.

As semiconductor technology has advanced and matured, it has become increasingly important within the context of fabricating semiconductor devices and semiconductor structures: (1) to use for patterned conductor layers copper containing conductor materials; and (2) to use for dielectric layers that separate those patterned conductor layers low dielectric constant dielectric materials. Low dielectric constant dielectric materials typically have a dielectric constant less than 4.0, and more preferably less than 3.0, where, for example, vacuum or air is understood to have a comparatively low dielectric constant of unity.

The use of copper containing conductor materials for patterned conductor layers within semiconductor structures is desirable insofar as such copper containing conductor materials provide for higher current carrying capabilities in comparison with other conductor materials. The use of low dielectric constant dielectric materials interposed between such patterned conductor layers comprising copper containing conductor materials is desirable insofar as such low dielectric constant dielectric materials provide for reduced cross-talk for adjacent patterned conductor layers.

Semiconductor technology is certain to continue to advance as semiconductor structure and semiconductor device dimensions decrease. To that end, desirable are semiconductor structures, and methods for fabricating those semiconductor structures, that provide the semiconductor structures with enhanced performance.

SUMMARY OF THE INVENTION

The invention provides a microelectronic, generally semiconductor, structure and a method for fabricating the microelectronic structure. The particular microelectronic structure and method provide that patterned conductor layers located within a dielectric layer located over a substrate are separated by a plurality of air gaps. The plurality of air gaps provides a low dielectric constant dielectric material interposed between the plurality of patterned conductor layers.

The particular microelectronic structure and method also include a liner layer lining the plurality of air gaps interposed between the plurality of patterned conductor layers and covering a top surface of the patterned conductor layers. The invention also contemplates that the patterned conductor layers may or may not have a self-aligned capping layer located thereupon, including a top surface of the patterned conductor layers, or top and sidewall surfaces of the patterned conductor layers. The invention further contemplates an optional spacer located and formed adjacent and adjoining the self-aligned capping layer.

A microelectronic structure in accordance with the invention includes a first dielectric layer located over a substrate. The structure also includes a plurality of conductor layers located embedded and planarized within the first dielectric layer and including a plurality of apertures interposed between the plurality of conductor layers. The structure also includes a liner incompletely filling the plurality of apertures. The structure also includes a second dielectric layer located upon the liner and enclosing a plurality of voids interposed between the liner and the second dielectric layer, and separating the plurality of conductor layers.

A method for fabricating a microelectronic structure in accordance with the invention includes forming a first dielectric layer over a substrate. The method also includes forming a plurality of conductor layers embedded and planarized within the first dielectric layer and including a plurality of apertures interposed between the plurality of conductor layers. The method also includes forming a liner incompletely filling the plurality of apertures. The method also includes forming a second dielectric layer upon the liner and enclosing a plurality of voids interposed between the liner and the second dielectric layer, and separating the plurality of conductor layers.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein.

DESCRIPTION OF THE PREFERRED EMBODIMENTS

The invention, which includes a microelectronic structure that includes patterned conductor layers located and planarized within a dielectric layer and separated by voids, and a method for fabricating the microelectronic structure, is understood within the context of the description set forth below. The description set for the below is understood within the context of the drawings described above. Since the drawings are intended for illustrative purposes, the drawings are not necessarily drawn to scale.

Figure 1:
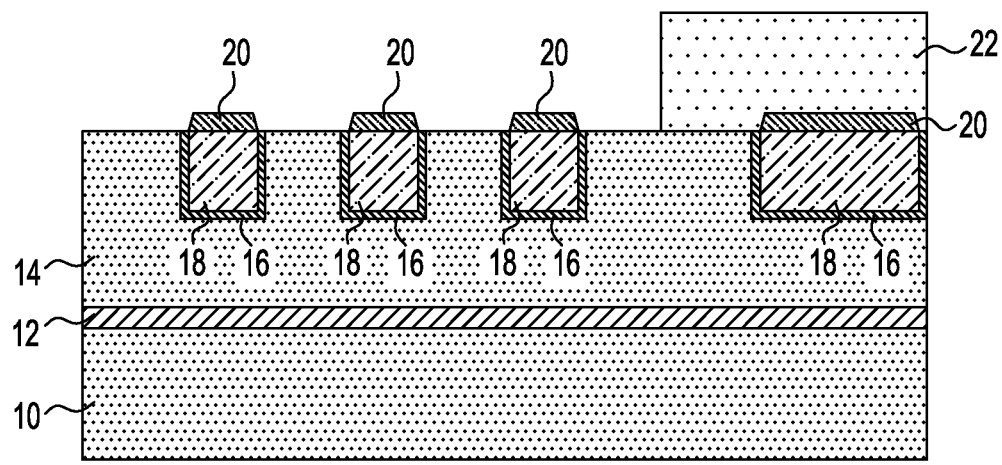
FIG. 1 to FIG. 3 show a series of schematic cross-sectional diagrams illustrating the results of progressive semiconductor structure fabrication (FIG. 1), dielectric layer etching (FIG. 2), liner formation and void formation (FIG. 3) process steps in accordance with a particular embodiment of the invention.
Figure 2:
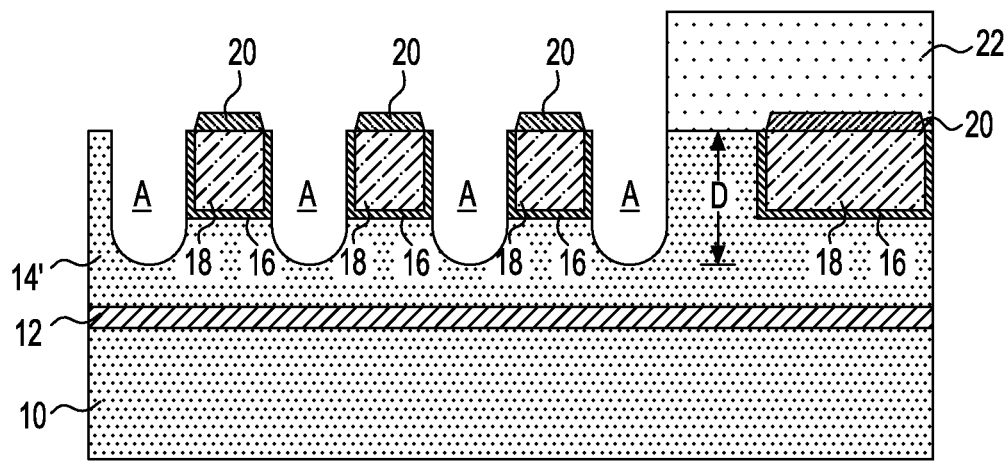
Figure 3:
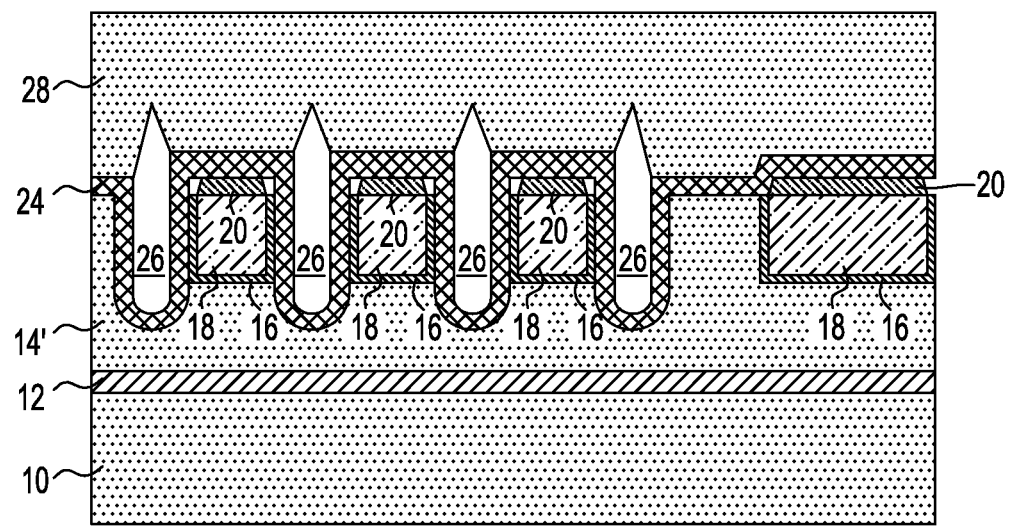

FIG. 1 to FIG. 3 show a series of schematic cross-sectional diagrams illustrating the results of progressive stages in fabricating a semiconductor structure in accordance with a particular embodiment of the invention. This particular embodiment of the invention comprises a first embodiment of the invention. FIG. 1 shows a schematic cross-sectional diagram of the semiconductor structure at an early stage in the fabrication thereof in accordance with this particular first embodiment.

FIG. 1 first shows a substrate 10. A first capping layer 12 is located and formed upon the substrate 10. A first dielectric layer 14 is located and formed upon the first capping layer 12. Located and formed embedded within the first dielectric layer 14 is a plurality of barrier layers 16 upon which in turn is located and formed a plurality of conductor layers 18. Located and formed upon the plurality of conductor layers 18 is a plurality of self-aligned capping layers 20. Located and formed upon the right-most self-aligned capping layer 20 and spanning over a portion of the first dielectric layer 14 is a mask 22.

Each of the foregoing substrate 10 and layers and structures located and formed thereupon or thereover may comprise materials, have dimensions and be formed using methods that are otherwise generally conventional in the semiconductor fabrication art or more broadly within the microelectronic fabrication art.

The substrate 10 (which commonly may represent a conductor layer or a semiconductor layer) may comprise any of several microelectronic materials including but not limited to conductor materials, dielectric materials and semiconductor materials to provide an invention most broadly within the context of a microelectronic structure. Semiconductor materials are particularly common but by no means limit the invention. Semiconductor substrate materials may include, but are not necessarily limited to silicon, germanium, silicon-germanium alloy, silicon-carbon alloy, silicon-germanium-carbon alloy and compound semiconductor materials. Compound semiconductor materials may include, but are not necessarily limited to gallium arsenide, indium arsenide and indium phosphide semiconductor materials. Typically, the substrate 10 comprises a silicon or silicon-germanium alloy semiconductor material that has a thickness from 0.01 to 1 millimeters.

Although the instant embodiment illustrates the invention within the context of a substrate 10 that may comprise (and by implication comprises) a bulk semiconductor substrate, the invention is not in particular so limited. Rather, when the substrate 10 comprises a semiconductor substrate, such a semiconductor substrate may comprise a bulk semiconductor substrate, a semiconductor-on-insulator substrate or a hybrid orientation substrate. Semiconductor-on-insulator substrates derive from bulk semiconductor substrates by the inclusion of a buried dielectric layer within a thickness of a bulk semiconductor substrate. Hybrid orientation substrates are intended as including multiple semiconductor regions of different crystallographic orientation.

Semiconductor-on-insulator substrates and hybrid orientation substrates may be fabricated using methods including but not limited to layer transfer methods, layer lamination methods and separation by implantation of oxygen methods.

Similarly, although not specifically illustrated within the schematic cross-sectional diagram of FIG. 1, when comprising a semiconductor substrate, the substrate 10 will also typically include, located and formed therein and/or thereupon, microelectronic devices, such as in particular semiconductor devices. Such microelectronic devices, including semiconductor devices, may include, but are not necessarily limited to resistors, transistors, capacitors and diodes.

The first capping layer 12 may comprise any of several capping materials. Non-limiting examples include conductor capping materials, dielectric capping materials and semiconductor capping materials. Typically, the first capping layer 12 comprises a dielectric capping material such as but not limited to a silicon oxide, silicon nitride, silicon carbide dielectric capping material (or alloys thereof or composites thereof), although oxides, nitrides and oxynitrides of other elements may also be used for capping materials. Such a dielectric capping material may be formed using methods including but not limited to chemical vapor deposition methods and physical vapor deposition methods. Typically, the first capping layer 12 comprises a silicon carbide, silicon nitride or a silicon-carbon-nitrogen alloy capping material that has a thickness from 2 to 200 nanometers.

The first dielectric layer 14 may comprise any of several dielectric materials. Suitable dielectric materials include, but are not necessarily limited to generally conventional higher dielectric constant dielectric materials (i.e., having a dielectric constant greater than 4.0). Dielectric materials that are included within this category may include, but are not necessarily limited to, silicon oxide, silicon nitride and silicon oxynitride dielectric materials. Oxides, nitrides and oxynitrides of other elements are again not excluded as suitable dielectric materials that may have a generally higher dielectric constant. The dielectric layer 14 may also comprise a generally lower dielectric constant dielectric material (i.e., less than 4.0, or more preferably less than 3.0, and more preferably from 2.0 to about 3.0), such as but not limited to a porous dielectric material, a nanoporous dielectric material, a carbon doped silicon oxide dielectric material, a fluorosilicate glass dielectric material or a spin-on-polymer dielectric material. The dielectric materials that are used within the context of either the higher dielectric constant dielectric materials or the lower dielectric constant dielectric materials for the first dielectric layer 14 may be formed using methods including but not limited to spin-on methods, chemical vapor deposition methods and physical vapor deposition methods. Typically, the first dielectric layer 14 comprises a generally lower dielectric constant dielectric material, such as but not limited to a carbon doped silicon oxide dielectric material. Typically, the first dielectric layer 14 has a thickness from 50 to 1000 nanometers.

The barrier layer 16 comprises a barrier material. Such a barrier material may comprise a conductor barrier material or a dielectric barrier material. Conductor barrier materials are more common. Non-limiting examples of conductor barrier materials include titanium, tungsten and tantalum barrier materials, as well as alloys of titanium, tantalum and tungsten barrier materials, composites of titanium, tantalum and tungsten barrier materials and nitrides of titanium, tungsten and tantalum barrier materials. The barrier layers 16 may be formed using methods including but not limited to chemical vapor deposition methods, physical vapor deposition methods, and thermal and plasma nitridation methods. Typically, the barrier layers 16 comprises a titanium, tungsten or tantalum barrier material, a nitride thereof or a composite thereof, that has a thickness from 0.5 to 20 nanometers. Although not specifically illustrated within the schematic cross-sectional diagram of FIG. 1, the barrier layers 16 may comprise multilayers having specific etch properties.

The conductor layers 18 may comprise any of several types of conductor materials, but more particularly comprise copper or copper alloy conductor materials. The copper or copper alloy conductor materials may be formed using methods that are coventional in the art. Such methods may include, but are not necessarily limited to chemical vapor deposition methods and physical vapor deposition methods. Plating methods are often common and not excluded. Typically, the conductor layers 18 are formed to a thickness from 50 to 1000 nanometers while using a plating method, and subsequently planarized while using a planarizing method.

The self-aligned capping layers 20 comprise a self-aligned capping material. Such a self-aligned capping material is typically a conductor material. Such a self-aligned capping material may include, but is not necessarily limited to, a cobalt-tungsten-phosphorus alloy capping material or a cobalt-tungsten-boron alloy capping material. Self-aligned capping layers that are formed of self-aligned capping materials are typically formed using plating methods that further include the use of suitable plating materials, although other methods and materials are not excluded. Typically, the self-aligned capping layers 20 comprise a cobalt-tungsten-phosphorus alloy or a cobalt-tungsten-boron alloy capping material that is located and formed upon the corresponding conductor layers 18 to a thickness from 2 to about 20 nanometers.

The mask 22 may comprise any of several mask materials. Photoresist mask materials and hard mask materials are particularly common, and within the context of the instant embodiment photoresist mask materials are more particularly common. Hard mask materials may include, but are not necessarily limited to silicon nitride hard mask materials and silicon oxynitride hard mask materials. Photoresist mask materials may include, but are not necessarily limited to positive photoresist materials, negative photoresist materials and hybrid photoresist materials that possess properties of both positive photoresist materials and negative photoresist materials. Photoresist mask materials may be formed using conventional spin-coating methods. Hard mask materials are typically formed using chemical vapor deposition methods and physical vapor deposition methods. Typically, the mask 22 comprises a photoresist mask material that has a thickness from 50 to 500 nanometers.

FIG. 2 shows the results of etching the dielectric layer 14 to form a dielectric layer 14' that includes a plurality of apertures A. Although not particularly illustrated within the schematic cross-sectional diagram of FIG. 1, the apertures A may in fact extend beneath (i.e., and provide an undercut) the barrier layers 16 and the conductor layers 18. Typically, the apertures A are formed using an etchant selected from the group including but not limited to isotropic etchants and anisotropic etchants. Such isotropic etchants and anisotropic etchants may be further selected from the groups including but not limited to wet chemical etchants and dry plasma etchants. Typically, the apertures A have a depth D within the dielectric layer 14' from 20 to 500 nanometers. The apertures A are typically formed using at least in part an anisotropic etch method.

FIG. 3 first shows the results of stripping the mask 22 from the semiconductor structure of FIG. 2. The mask 22 may be stripped from the semiconductor structure of FIG. 2 to provide in-part the semiconductor structure of FIG. 3 while using stripping methods and stripping materials that are otherwise generally conventional in the semiconductor fabrication art. Such stripping methods and stripping materials may include, but are not necessarily limited to, wet chemical stripping methods and materials and dry plasma stripping methods and materials. Typically, the mask 22 is stripped using a wet chemical stripping method, a dry plasma stripping method, or a combination of a wet chemical stripping method and a dry plasma stripping method to provide in-part the semiconductor structure of FIG. 3 from the semiconductor structure of FIG. 2.

FIG. 3 also shows a liner 24 located and formed upon the semiconductor structure of FIG. 2 after having stripped therefrom the mask 22. The liner 24 comprises a liner material that is typically a dielectric liner material. A non-exclusive purpose of the liner 24 is to provide an oxidation barrier towards diffusion of a metal within the conductor layers 18, and oxygen, that would result in oxidation of the metal within the conductor layers 18. The liner 24 may comprise a dielectric material including but not limited to a silicon nitride dielectric material and a carbon doped silicon nitride dielectric material. Such a silicon nitride dielectric material or carbon doped silicon nitride dielectric material may be deposited using methods including but not limited to chemical vapor deposition methods and physical vapor deposition methods. Typically, the liner 24 comprises a silicon nitride dielectric material or a carbon doped silicon nitride dielectric material, or an additionally hydrogenated derivative, that has a thickness from 5 to 500 nanometers.

FIG. 3 finally shows a second dielectric layer 28 located and formed upon the liner 24. The second dielectric layer 28 may comprise materials, and be formed using methods that are analogous, equivalent or identical to the methods and materials that are used for forming the first dielectric layer 14 or 14'. However, the second dielectric layer 28 is a non-conformal dielectric layer that is typically deposited by chemical vapor deposition or plasma enhanced chemical vapor deposition methods. Although FIG. 3 illustrates a complete absence of a second dielectric layer 28 residue within the voids 26, a comparatively small (i.e., one to several monolayers) of second dielectric layer 28 residue may line an inside of the voids 26. More typically, the second dielectric layer 28 comprises a carbon and hydrogen doped silicon oxide dielectric material, a plasma enhanced chemical vapor deposition deposited dielectric material, a fluorinated silicate glass dielectric material or a similar dielectric material that has a thickness from 50 to 1000 nanometers.

As is illustrated within the schematic cross-sectional diagram of FIG. 3, and as suggested above, there is formed the plurality of voids 26 enclosed by the liner 24 and the second dielectric layer 28 and interposed between the conductor layers 18. The plurality of voids 26 is formed under specific deposition conditions of a dielectric material from which is comprised the second dielectric layer 28. Particular deposition conditions that provide the plurality of voids 26 interposed between the liner 24 and the second dielectric layer 28 include a non-conformal deposition profile that may typically be obtained by chemical vapor deposition and plasma enhanced chemical vapor deposition techniques.

FIG. 3 shows a schematic cross-sectional diagram of a semiconductor structure in accordance with a particular embodiment of the invention that comprises a first preferred embodiment of the invention. The semiconductor structure whose schematic cross-sectional diagram is illustrated in FIG. 3 includes a plurality of voids 26 located and formed interposed between a plurality of patterned conductor layers 18. The plurality of voids 26 is lined in-part by a liner 24. The plurality of voids 26 provides for enhanced performance of the semiconductor structure of FIG. 3 due to the presence of a comparatively low dielectric constant dielectric material interposed between the plurality of conductor layers 18.

Figure 4:
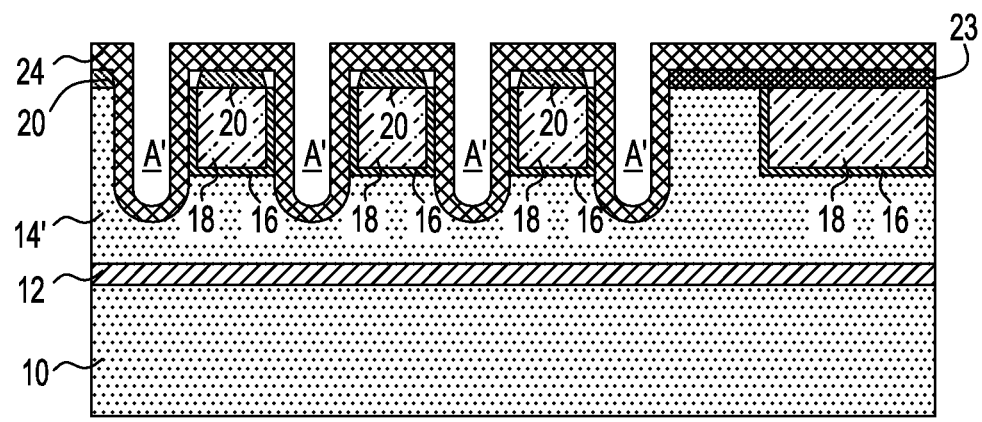
FIG. 4 and FIG. 5 show a plurality of schematic cross-sectional diagrams of a semiconductor structure including liner formation (FIG. 4) and void formation (FIG. 5) in accordance with another particular embodiment of the invention.
Figure 5:
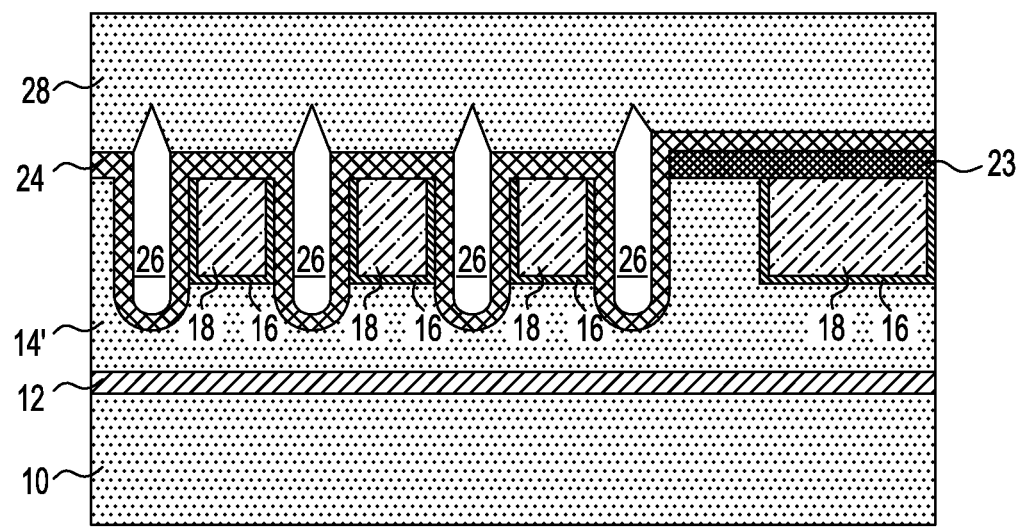

FIG. 4 and FIG. 5 show a plurality of schematic cross-sectional diagrams illustrating the results of progressive process steps in fabricating a semiconductor structure in accordance with another particular embodiment of the invention that comprises a second embodiment of the invention. FIG. 4 shows a schematic cross-sectional diagram of the semiconductor structure at an early stage in the fabrication thereof in accordance with this second embodiment.

FIG. 4 shows a semiconductor structure generally analogous with the semiconductor structure whose schematic cross-sectional diagram is illustrated in FIG. 2, but with the presence of a second capping layer 23 located and formed upon the right hand portion of the semiconductor structure prior to forming the liner 24 thereupon.

The semiconductor structure of FIG. 4 derives from the semiconductor structure of FIG. 2, but with the presence the second capping layer 23 located and formed upon the right hand portion of the semiconductor structure in the alternative of a self-aligned capping layer 21.

The semiconductor structure of FIG. 4 is first fabricated similarly with the semiconductor structure of FIG. 1 absent the self-aligned capping layers 21, and with a second capping layer interposed between the first dielectric layer 14 and the mask 22. Such a second capping layer is then etched to provide the second capping layer 23 while using the mask 22 as an etch mask, and also thereafter the self-aligned capping layers 21 are formed upon the exposed left hand conductor layers 18, but not upon the right hand conductor layer 18. The liner 24 is then formed lining the apertures A that are illustrated in FIG. 2 to provide apertures A' that are illustrated in FIG. 4, and covering the second capping layer 23 (and also the conductor layers 18).

FIG. 5 shows the results of forming the second dielectric layer 24 upon the semiconductor structure of FIG. 4. Similarly with the first embodiment of the invention, the second embodiment includes a plurality of voids 26 located and formed interposed between the plurality of conductor layers 18 and lined in-part by the liner 24. The plurality of voids 26 provides for enhanced operation of the semiconductor structure of FIG. 5.

Figure 6A:
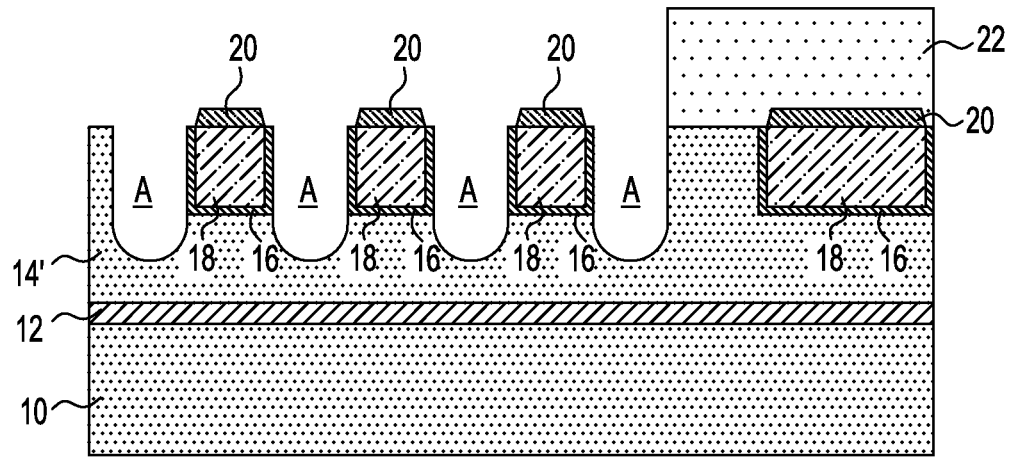
FIG. 6A to FIG. 6C shows a series of schematic cross-sectional diagrams of a semiconductor structure including aperture formation (FIG. 6A), self-aligned capping layer stripping (FIG. 6B) and liner layer formation and void formation (FIG. 6C) in accordance with another particular embodiment of the invention.
Figure 6B:
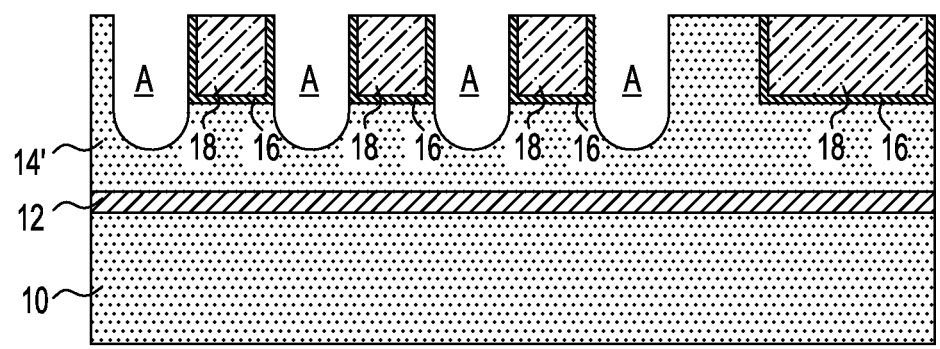
Figure 6C:
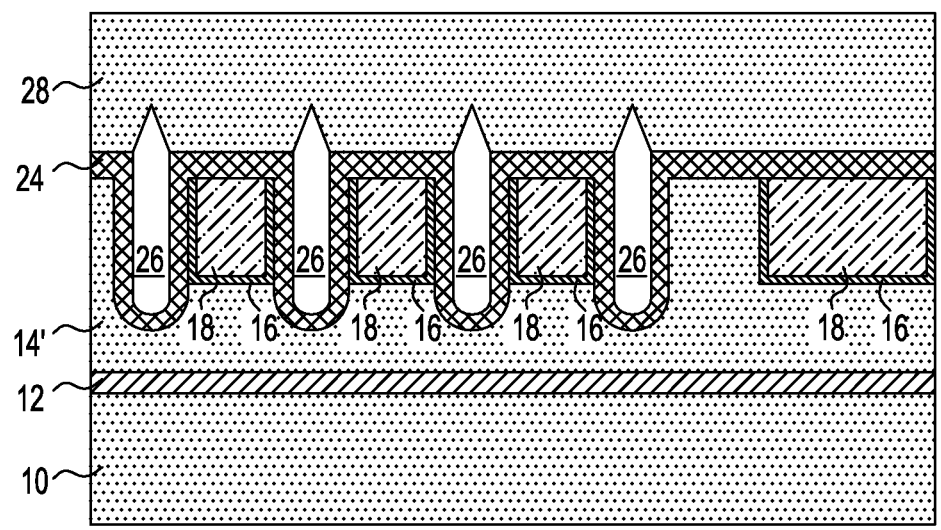

FIG. 6A to FIG. 6C show a series of schematic cross-sectional diagrams illustrating the results of progressive stages in fabricating a semiconductor structure in accordance with another particular embodiment of the invention. This other particular embodiment of the invention comprises a third embodiment of the invention. FIG. 6A shows a schematic cross-sectional diagram of the semiconductor structure at an early stage in the fabrication thereof in accordance with this particular third embodiment.

FIG. 6A shows a schematic cross-sectional diagram corresponding with the semiconductor structure whose schematic cross-sectional diagram is illustrated in FIG. 2. FIG. 6B shows the results of stripping the mask 22 and the self-aligned capping layers 20 from the semiconductor structure whose schematic cross-sectional diagram is illustrated in FIG. 6A. FIG. 6C finally shows the second dielectric layer 28 located and formed upon the liner 24 incident to further processing of the semiconductor structure of FIG. 6B. The semiconductor structure of FIG. 6C thus corresponds with the semiconductor structure of FIG. 3, but absent the self-aligned capping layers 20. The semiconductor structure of FIG. 6C may also be fabricated from the semiconductor structure of FIG. 1 in a first instance, with an initial absence of the self-aligned capping layers 20. However, the processing scheme of the schematic cross-sectional diagrams of FIG. 6A to FIG. 6C advantageously provides the self-aligned capping layers 20 as a plurality of sacrificial protective layers for the plurality of conductor layers 18 during the etching of the apertures A' within the first dielectric layer 14'.

Figure 7A:
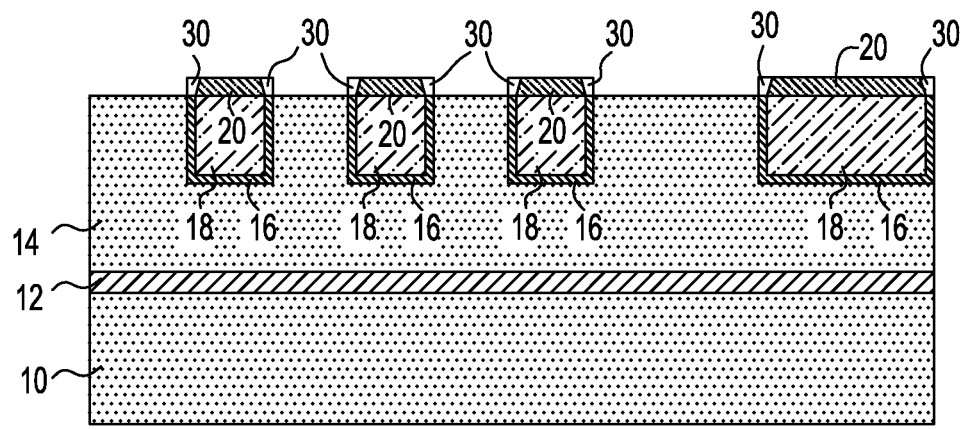
FIG. 7A and FIG. 7B show a plurality of schematic cross-sectional diagrams of a semiconductor structure including spacer layer formation (FIG. 7A), aperture formation, liner layer formation and void formation (FIG. 7B) in accordance with another particular embodiment of the invention.
Figure 7B:
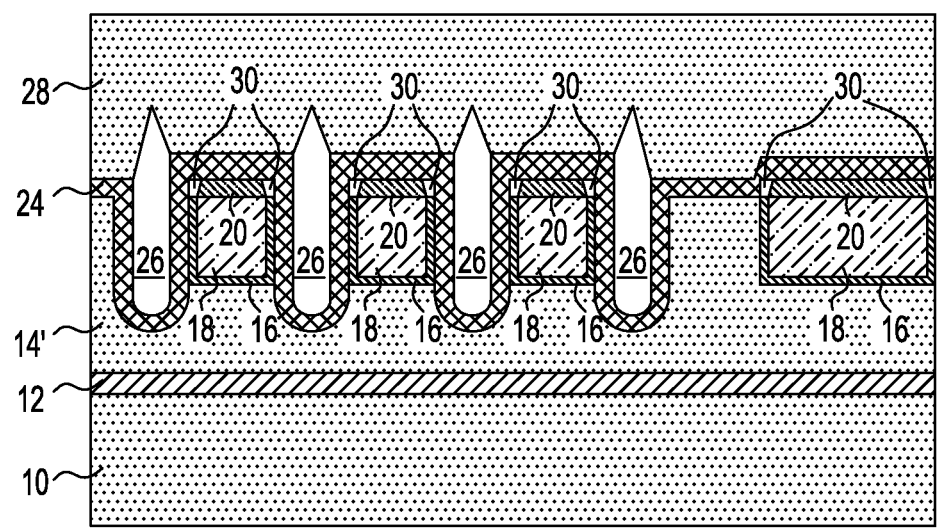

FIG. 7A and FIG. 7B show a pair of schematic cross-sectional diagrams illustrating the results of progressive stages in fabricating a semiconductor structure in accordance with yet another embodiment of the invention. This other embodiment of the invention comprises a fourth embodiment of the invention. FIG. 7A shows a schematic cross-sectional diagram of the semiconductor structure at an early stage in fabrication thereof in accordance with this fourth embodiment.

FIG. 7A illustrates spacers 30 located and formed adjacent and adjoining the self-aligned capping layers 20. The spacers 30 may comprise conductor spacer materials, semiconductor spacer materials or dielectric spacer materials. More particularly, the spacers 30 comprise conductor spacer materials or dielectric spacer materials. Dielectric spacer materials are generally more common and may provide a desirable etch selectivity with respect to surrounding materials. The spacers 30 may be formed using blanket layer deposition and etch-back methods that are otherwise generally conventional in the semiconductor fabrication art. Included in particular, but also not limited, are anisotropic dry plasma etch methods. Within this particular embodiment, the spacers 30 are intended as having a linewidth equal or less than a thickness of the barrier layers 16.

FIG. 7B shows the results of forming the second dielectric layer 28 upon the semiconductor structure of FIG. 7A after having: (1) etched the first dielectric layer 14 to provide a first dielectric layer 14'; and (2) formed the liner 24 upon the resulting structure, to thus form the enclosed voids 26. Within the schematic cross-sectional diagrams of FIG. 7A and FIG. 7B, the spacers 30 are intended to protect exposed end surfaces if the barrier layers 16 and exposed sidewall surfaces of the self-aligned capping layers 21. The semiconductor structure of FIG. 7B otherwise possesses similar advantages to the resulting semiconductor structures in accordance with foregoing embodiments due to the presence of the voids 26.

Figure 8A:
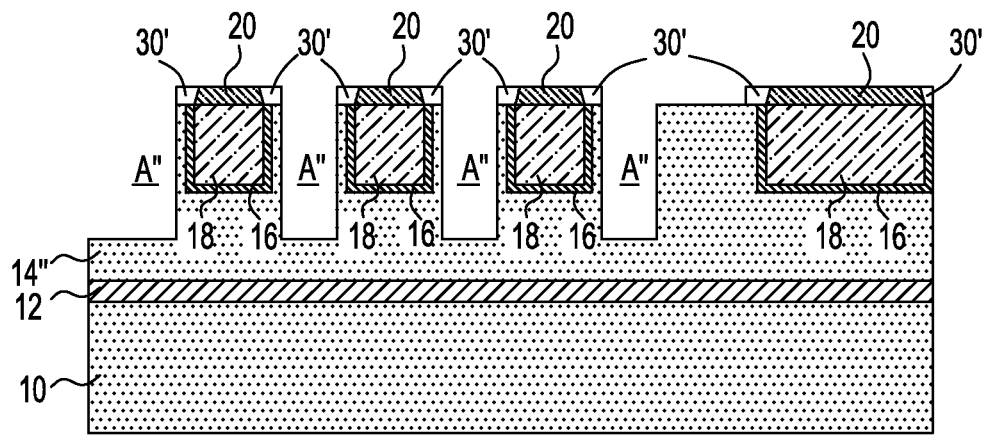
FIG. 8A and FIG. 8B show a plurality of schematic cross-sectional diagrams of a semiconductor structure including spacer formation and aperture formation (FIG. 8A) and aperture etch-back (FIG. 8B) in accordance with yet another particular embodiment of the invention.
Figure 8B:
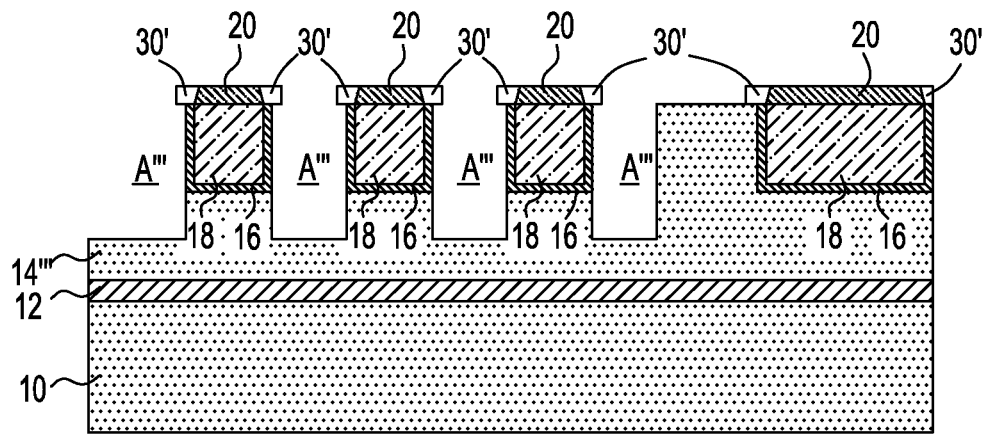

FIG. 8A and FIG. 8B show a plurality of schematic cross-sectional diagrams illustrating the results of progressive stages in fabricating a semiconductor structure in accordance with another embodiment of the invention. This other embodiment of the invention comprises a fifth embodiment of the invention. FIG. 8A shows spacers 30' located and formed adjacent and adjoining the sidewalls of the self-aligned capping layers 20. The spacers 30' may comprise dielectric materials, have dimensions and be formed of materials analogous, equivalent or identical to the methods and dielectric materials that are used for forming the spacers 30 that are illustrated in FIG. 7A and FIG. 7B, but are of a wider width in a range from 5 to about 100 nanometers (i.e., in comparison with a width from about 2 to about 20 for the spacers 30) that cover a portion of a first dielectric layer in addition to the barrier layers 16. As a result, a first dielectric layer 14" including apertures A" is formed when etching the dielectric layer 14 as is illustrated in FIG. 1, rather than the dielectric layer 14' including apertures A that is illustrated in FIG. 2.

FIG. 8B shows the results of etching back the aperture A" to form a plurality of apertures A''' that are wider than the apertures A". Upon further processing of the semiconductor structure of FIG. 8B, by formation of a liner 24 thereupon and a second dielectric layer 28 thereupon the liner 24, the presence of the spacers 30' provides for a more effective pinch-off of the second dielectric layer 28 when forming the voids 26.

Figure 9A:
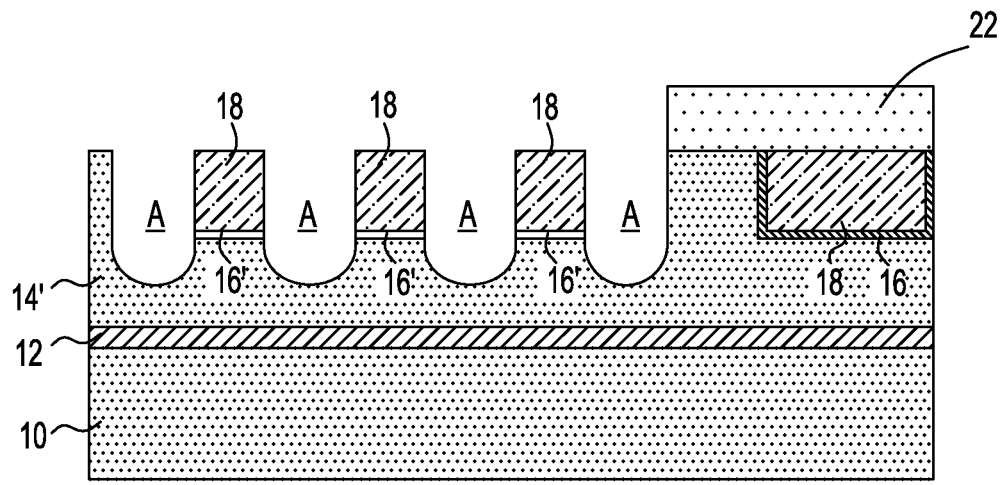
FIG. 9A to FIG. 9C show a plurality of schematic cross-sectional diagrams of a semiconductor structure including aperture formation (FIG. 9A), self-aligned capping layer formation (FIG. 9B) and void formation (FIG. 9C) in accordance with yet another particular embodiment of the invention.
Figure 9B:
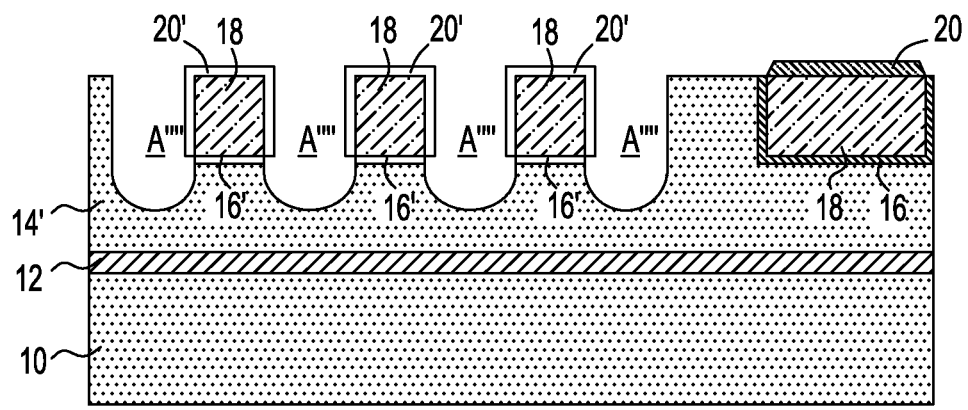
Figure 9C:
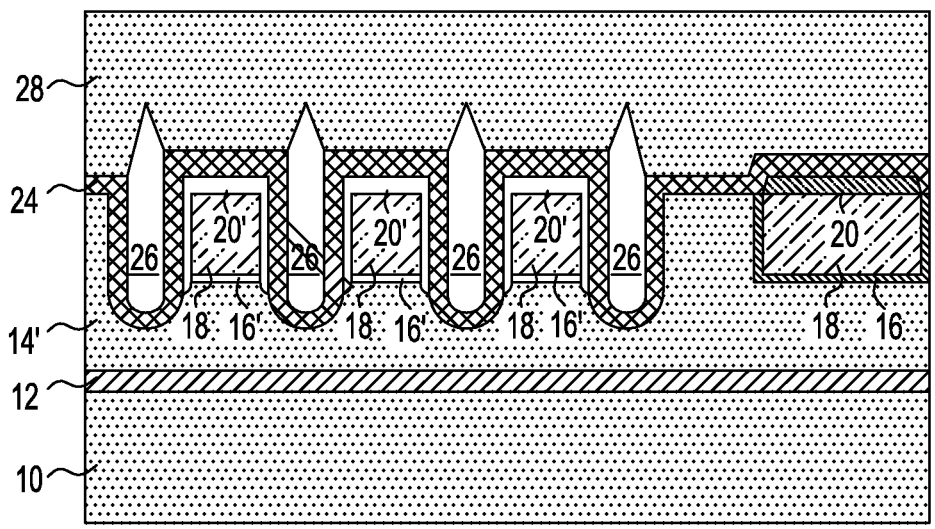

FIG. 9A to FIG. 9C show a series of schematic cross-sectional diagrams illustrating the results of progressive stages in fabricating a semiconductor structure in accordance with yet another embodiment of the invention. This additional embodiment of the invention comprises a sixth embodiment of the invention. FIG. 9A shows a schematic cross-sectional diagram of the semiconductor structure at an early stage in the fabrication thereof in accordance with this sixth embodiment.

FIG. 9A correlates with FIG. 2, but with an absence of the self-aligned capping layers 20, and with the absence also of sidewall portions of the barrier layers 16, to thus provide barrier layers 16'. The sidewall portions of the barrier layers 16 may be stripped to provide the barrier layers 16' while using etch methods and materials that are otherwise generally conventional in the semiconductor fabrication art. Such etch methods may include, but are not necessarily limited to wet chemical etch methods and dry plasma etch methods. Isotropic etch methods are preferred due to sidewall etching capabilities.

FIG. 9B shows self-aligned capping layers 20' that are located and formed upon sidewall and top portions of the left hand conductor layers 18, but not the right hand conductor layer 18 to provide apertures A'''' from the apertures A that are illustrated in FIG. 9A. The self-aligned capping layers 20' are formed using the same plating method that is used for forming the self-aligned capping layers 20, and due to absence of sidewall portions of the barrier layers 16', the self-aligned capping layers 20' are formed upon sidewall portions of the conductor layers 18.

FIG. 9C shows the second dielectric layer 28 located and formed upon a liner 24 located and formed upon the semiconductor structure of FIG. 9B, to thus form voids 26 enclosed by the liner 24 and the second dielectric layer 28 and interposed between the conductor layers 18.

The semiconductor structure of FIG. 9C provides value insofar as the self-aligned capping layers 20' provide full coverage of top portions and sidewall portions of the conductor layers 18. Otherwise, the semiconductor structure of FIG. 9C provides the advantages of the semiconductor structure of FIG. 3 with respect to the presence of the voids 26.

The preferred embodiments are illustrative of the invention rather than limiting of the invention. Revisions and modifications may be made to methods, materials, structures and dimensions of a semiconductor structure in accordance with the preferred embodiments, while still providing a microelectronic structure in accordance with the invention, further in accord with the accompanying claims.

What is claimed is:

1. A microelectronic structure comprising:
   a first dielectric layer located over a substrate;
   a plurality of conductor layers located embedded and planarized within the first dielectric layer and including a plurality of apertures interposed between the plurality of conductor layers;
   a liner layer incompletely filling the plurality of apertures;
   a second dielectric layer located upon the liner layer and enclosing a plurality of voids interposed between the liner layer and the second dielectric layer, and separating the plurality of conductor layers;
   a plurality of barrier layers located upon bottom and sidewall portions of the plurality of conductor layers;
   a plurality of capping layers aligned upon top surfaces of the plurality of conductor layers; and
   a plurality of spacers adjoining a sidewall of the plurality of capping layers and having a thickness greater than a width of the barrier layer.

2. The structure of claim 1 wherein the plurality of voids extends within the dielectric layer deeper than the plurality of conductor layers.

3. The structure of claim 1 wherein the plurality of voids undercuts the plurality of conductor layers.

4. The structure of claim 1 wherein said first dielectric layer comprises a dielectric material having a dielectric constant of greater than 4.0.

5. The structure of claim 1 wherein said first dielectric layer comprises a dielectric material having a dielectric constant of less than 4.0.

6. The structure of claim 1 wherein said plurality of conductor layers comprise copper or a copper alloy.

7. The structure of claim 1 wherein said second dielectric layer comprises a dielectric material having a dielectric constant of greater than 4.0.

8. The structure of claim 1 wherein said second dielectric layer comprises a dielectric material having a dielectric constant of less than 4.0.

9. The structure of claim 1 wherein said a plurality of voids are enclosed by a dielectric liner material.

10. The structure of claim 9 wherein said dielectric liner material comprises silicon nitride.

11. The structure of claim 9 wherein said dielectric liner material comprises carbon doped silicon nitride.

12. The structure of claim 9 wherein said plurality of voids having an uppermost portion that extends above an uppermost surface of said dielectric liner material.

* * * * *